United States Patent [19]

Patt

[11] 4,438,400

[45] Mar. 20, 1984

[54] METHOD FOR SUPPRESSION OF ACOUSTIC RINGING IN NMR MEASUREMENTS

[75] Inventor: Steven L. Patt, Gillette, N.J.

[73] Assignee: Varian Associates, Inc., Palo Alto, Calif.

[21] Appl. No.: 340,576

[22] Filed: Jan. 18, 1982

[51] Int. Cl.³ .............................................. G01R 33/08
[52] U.S. Cl. ..................................... 324/312; 324/307
[58] Field of Search ................. 324/300, 307, 309, 312

[56] References Cited

U.S. PATENT DOCUMENTS 4,297,637 10/1981 Crooks ................................. 324/309
4,339,716 7/1982 Young ................................. 324/309
4,383,219 5/1983 Kaplan ................................. 324/309

Primary Examiner—Michael J. Tokar
Attorney, Agent, or Firm—Stanley Z. Cole; Edward H. Berlowitz

[57] ABSTRACT

Compensation rather than direct suppression removes the effects of acoustic ringing as encountered in pulsed nuclear magnetic resonance experiments. Single and double spin-echo excitation, combined with several alternative schemes for phase cycling both transmitter and receiver, is one type of compensatory technique. Another technique consists of acquiring free induction decay signals in pairs, with the second preceded by an inversion pulse a short time prior to the normal excitation pulse, and with the second acquisition acquired subtractively, assuring phase coherence of the signals and phase opposition and hence cancellation of the acoustic ringing. Phase cycling of the inversion pulse may also be employed in the latter technique to suppress acoustic ringing stimulated by the inversion pulse.

6 Claims, 11 Drawing Figures

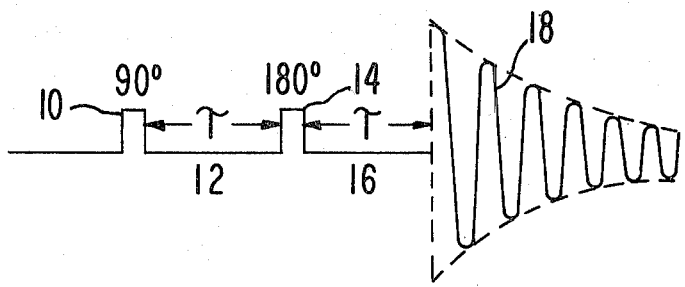
FIG.1 PRIOR ART
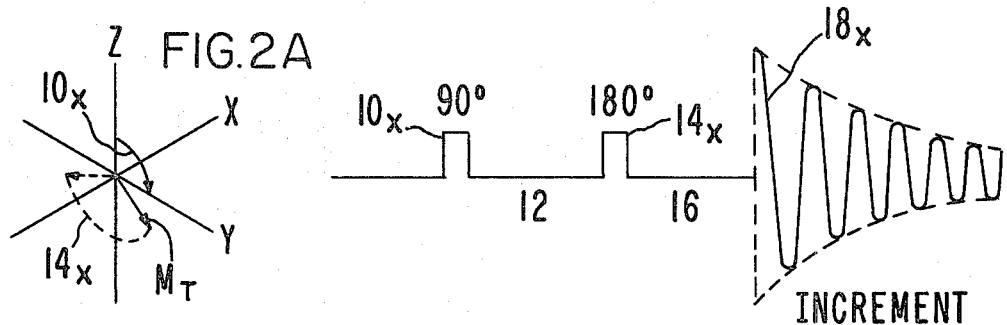
FIG.2A INCREMENT
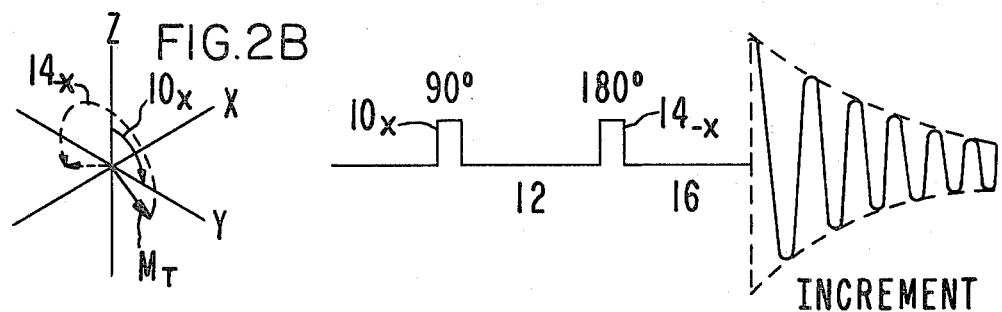
FIG.2B INCREMENT
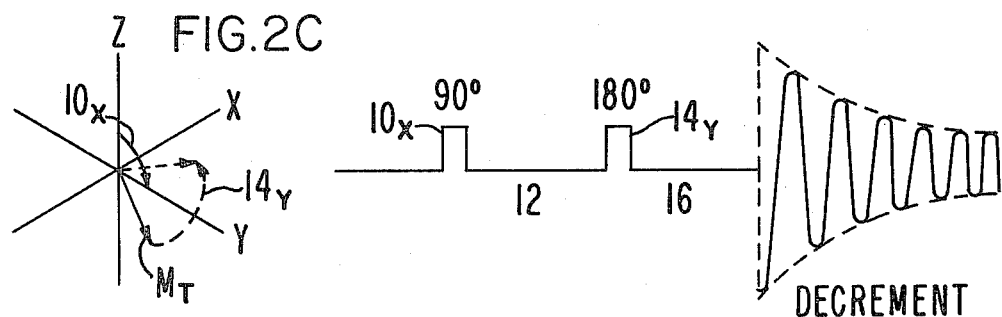
FIG.2C DECREMENT
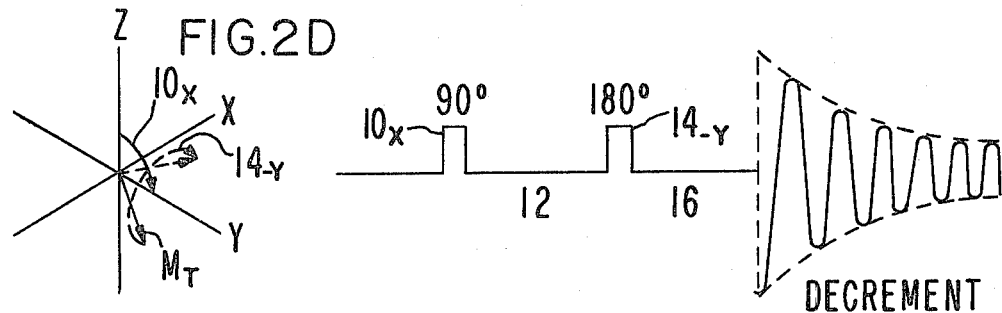
FIG.2D DECREMENT

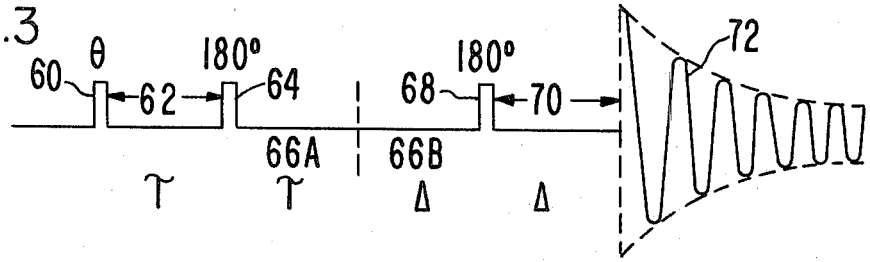
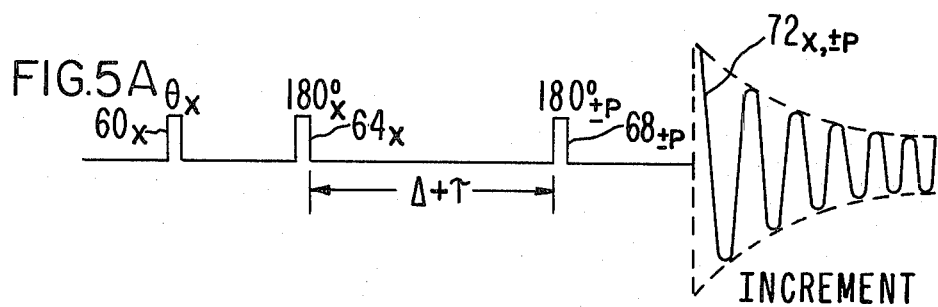
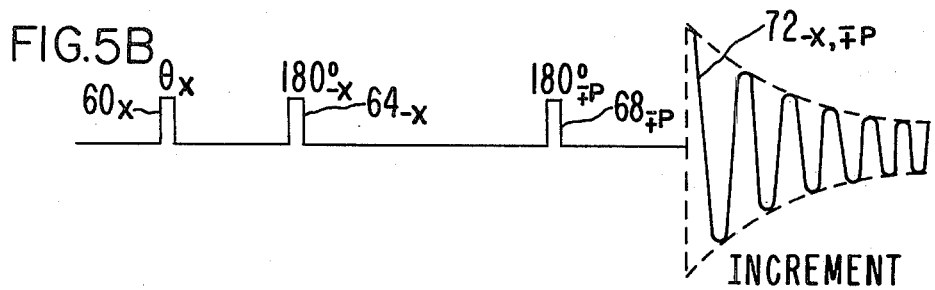
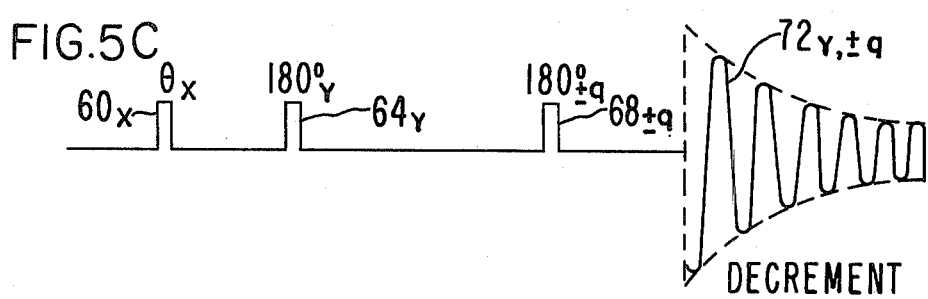
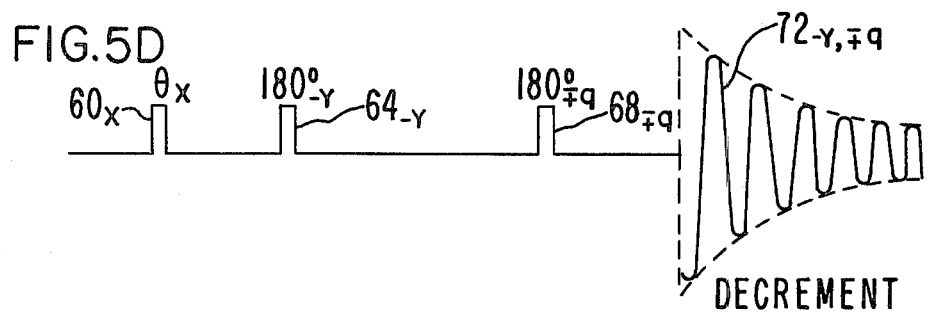

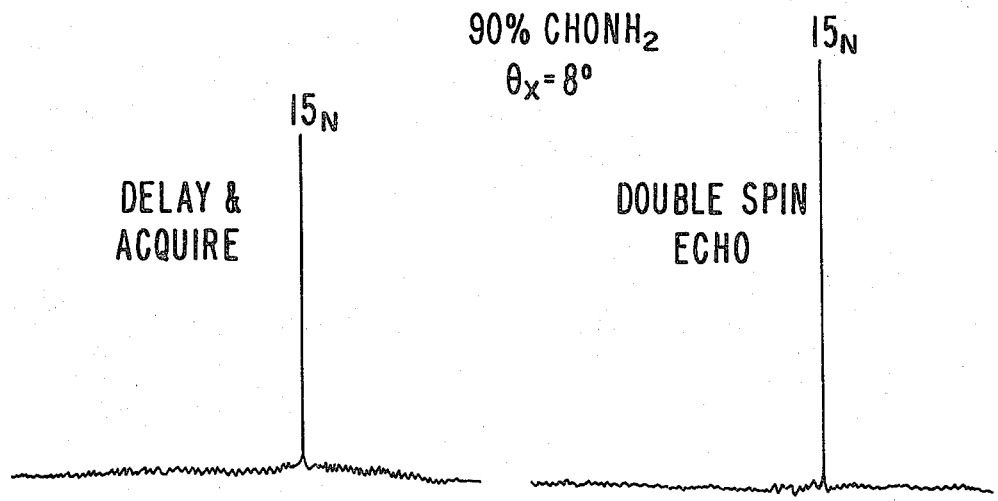
FIG.4A  FIG.4B
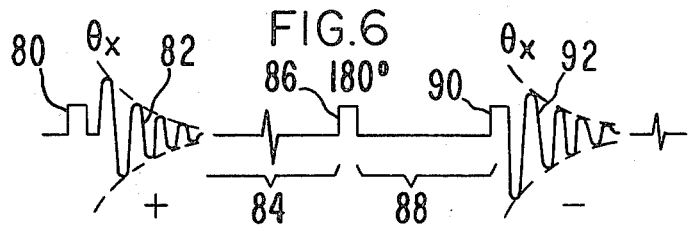
FIG.6
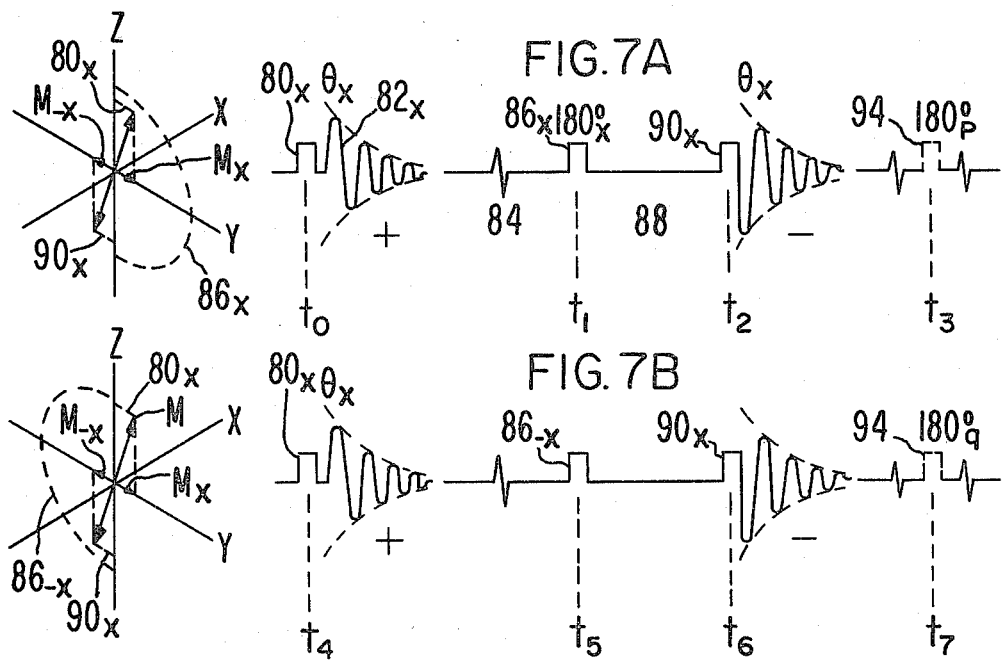
FIG.7A
FIG.7B

METHOD FOR SUPPRESSION OF ACOUSTIC RINGING IN NMR MEASUREMENTS

BACKGROUND OF THE INVENTION

This invention pertains to Fourier transform nuclear resonance spectroscopy and, in particular, relates to the removal or compensation of acoustic ringing phenomena from pulse excited resonance data.

The modern practice of NMR spectroscopy employs pulsed excitation of the resonating systems followed by acquisition of the time domain response, that is to say, a waveform. The information contained in the waveform yields a frequency spectrum upon appropriate Fourier transformation. A number of parasitic effects accompany the practice of FT-NMR and the resulting artifacts in the spectrum may be minimized by appropriate measures directed to the cause, or in many instances the artifact may be cancelled by exploiting the difference in coherence properties between the nuclear resonance signal and the artifact.

It is known that high frequency currents in conductors situated in static magnetic fields can give rise to standing ultrasonic waves which through a reverse mechanism produce a resonant-like signal. The parasitic effect has often been observed and is discussed at length by Fukushima et al, *Journal of Magnetic Resonance*, Vol. 33, pages 199-203 (1979) who also discuss measures for minimizing the effect by choice of materials and equipment design configuration.

Acoustic ringing is a broad resonance-like phenomenon reflecting the strong coupling of the high frequency current with a crystal lattice in the static field. The resulting standing wave is therefore characterized by rather short decay times. Nevertheless, the amplitude is large and short duration NMR signals may be completely lost in comparison with this transient.

In the prior art it has been recognized that short-lived resonances may be removed from spectra by the simple expedient of interposing a delay between the excitation and detection of resonance. Relatively long NMR signals are observed without difficulty in the presence of the short acoustic ringing by delaying the acquisition for a suitable period to permit the acoustic ringing to attenuate. Unfortunately this strategy will introduce a frequency-dependent phase shift for which compensation will ultimately be required and separately the signal-to-noise factor will be reduced by the decay of signal strength during the delay period.

In a more sophisticated elaboration of the conquer-by-delay approach, a spin echo measurement has been used to substantially preserve the resonance signal during the decay of the instrumental ringing. The phase shift introduced by the simple delay and acquire method is eliminated by the spin echo measurement, but a signal attenuation factor, $e^{-2\tau/T_2}$ must be sustained. Moreover, spin echo measurements introduce acoustic ringing with the inversion pulse as well as with the observe pulse and the choice of refocussing time is necessarily long enough to permit the inversion pulse ringing to attenuate.

BRIEF DESCRIPTION OF THE INVENTION

It is an object of the invention to compensate for the presence of acoustic ringing superimposed on pulse excited NMR signals.

In a feature of a first embodiment, a set of spin echo measurements are obtained wherein the relative phase of corresponding inverting pulses with respect to each of four 90° pulses (the latter phased in a given z-x plane) is cycled between x, −x, y and −y half planes containing the common polarizing axis z, and the signal accumulation is respectively incremental (additive), incremental, decremental (subtractive) and again decremental whereby the ringing components are cancelled.

In one feature of another embodiment of the invention magnetization vectors are tipped with respect to the polarizing field by a selected angle $\theta$ and the interval between the initial tipping of the magnetization vectors and the acquisition of data comprises, in order, a unit of dephasing delay followed by a 180° pulse, followed in turn by two units of delay for progressive phasing-dephasing again followed by another 180° pulse and another unit of delay for progressive phase restoration whereby the signal is preserved as a double spin echo over the total interval between initial tipping and observation, while the acoustic ringing component decays over the same interval and the system is restored to its original orientation.

In another feature of double spin echo measurements for ringing compensation, consecutive double spin echo measurements are employed with corresponding inverting pulses cycled in phase with respect to the excitation pulses of constant phase by 0° and 180° with additive storage of the respective signals and by 90° and 270° with accumulation of the complements of the corresponding signals resulting therefrom.

In a feature of still another embodiment of the invention the magnetization vector is tipped through a selected angle $\theta$ with respect to the polarizing field and acquisition of the resonance signal is initiated at a first phase, followed by a constant delay period; then the inversion of the resonance by 180° pulse and a selected delay is concluded by again tipping the magnetization along the first axis and acquiring the signal at a phase opposite said first phase whereby the ringing from each of the two tipping pulses cancels while the resonance signal from said tipping pulses is effectively additive.

In another feature of said still another embodiment, the plane, wherein the resonators are tipped with respect to the z axis, is rotated about said z axis sequentially to project the magnetization vector in planes containing the axes x, and −x, (or y and −y) whereby acoustic ringing due to the 180° pulses in the corresponding planes also cancels over a sequence of four excitations.

BRIEF DESCRIPTION OF THE DRAWINGS

FIG. 1 is a simple spin echo sequence of the prior art.

FIGS. 2 A-D illustrates a phase cycled spin echo sequence of the present invention.

FIG. 3 is a double spin echo pulse sequence of the present invention.

FIG. 4 compares spectra obtained using the sequence of FIG. 3 with a prior art spectrum.

FIG. 5 is a phase cycled double spin echo sequence of the present invention.

FIG. 6 illustrates another embodiment of the present invention.

FIG. 7 is a variation of the embodiment of FIG. 6 for suppression of acoustic ringing of 180° pulses.

DETAILED DESCRIPTION OF THE INVENTION

Figure 8A:
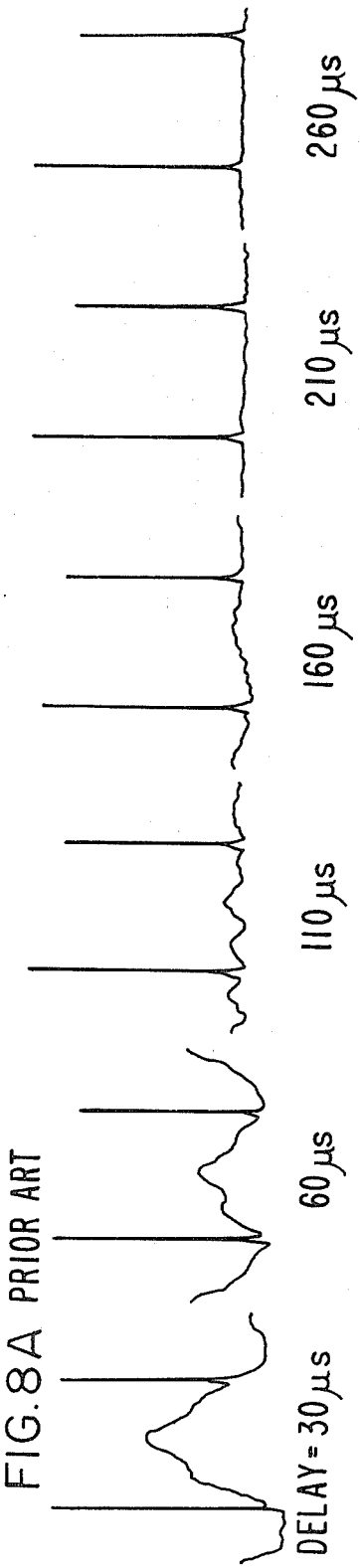
FIG. 8 compares specta obtained using the method of FIG. 7, with prior art method and a double spin echo method.

Turning now to FIG. 1, the classic spin echo measurement of prior art is implemented by the sequence of FIG. 1. A 90° pulse 10 rotates the z component of magnetization into the x-y plane. In accord with the usual convention, the z axis is taken parallel to the polarizing magnetic field. The precession frequency of the magnetization vector is distributed over the frequency spectrum in a frequency interval determined by chemical shifts of the sample. After a period 12 of length $\tau$, during which the precession frequency distribution disperses over a frequency interval determined by the chemical shifts, a 180° pulse 14 is applied to invert the magnetization in the z axis. This is operatively equivalent to inversion of the phase dispersion of all precessing vectors. After a re-focusing period 16, again of length $\tau$, the signal 18 is observed. The signal during this process attenuates exponentially with time constant $2\tau/T_2$, where $T_2$ is the transverse relaxation time. Where acoustic ringing decays with a time constant $T_r << T_2$, the resulting signal is substantially free of artifact. If, on the other hand, $T_r \approx T_2$, the spectrum will be affected thereby. Ringing is introduced by both pulses 10 and 14 and the refocussing interval is governed thereby. Apart from the constraint upon the relaxation times $T_2$, characteristic of the observed resonances, this method demands 90° pulses to rotate the entire magnetization into the x-y plane. Remanent magnetization along the z axis is left inverted at the conclusion of the elementary measurement.

Simple spin echo measurements of the above description can again be classified in the relative phase accorded to the 90° flip and the 180° refocusing pulse. Using standard notation, a $90°_x$ pulse rotates the magnetization 90° with respect to the Z axis, the rotation carried out about the x axis. A rotation about the $-x$ axis has the opposite sense, e.g., occurs in the opposite half plane. The Meiboom-Gill sequence is represented by the pulses $90°_x - \tau - 180°_y - \tau$ — acquire, while the Carr-Purcell sequence is represented the pulse program $90°_x - \tau - 180°_x - \tau$ — acquire. Both the 90° and 180° pulses of a single spin echo measurement are sources of acoustic ringing. An example of a preferred method to compensate ringing in a single spin echo type measurement is shown in FIGS. 2. The subsequence of FIG. 2A describes a typical Carr-Purcell measurement. This is followed by a second subsequence (FIG. 2B) again of the Carr-Purcell form which is distinguished by the opposite phase relationship for the 180° pulse $14_{-x}$ with respect to the corresponding 180° pulse $14_x$ of FIG. 2A. Cumulative time domain signals for these two subsequences will add the ringing due to the 90° pulses $10_x$ while cancelling the ringing due to the 180° pulses $14_x$ and $14_{-x}$. The subsequences of FIGS. 2C and 2D corresponding to the Meiboom-Gill sequence perform the same cancellation as between the respective 180° pulses $14_y$ and $14_{-y}$ while the ringing from the respective 90° pulses $10_x$ again adds. Since the acquisitions are now effectively subtracted for subsequences of FIGS. 2C and 2D from the cumulative signal, the summed 90° ringing components of FIGS. 2A and 2B will together cancel the summed 90° ringing components of subsequences of FIGS. 2C and 2D. The effective subtraction may be implemented by altering the receiver phase as shown, or by subtraction of the digitized signal presently acquired from the cumulative stored signal by straightforward digital means. The signal, having been phase inverted for the latter two subsequences, will now reinforce and all ringing will have been cancelled.

At the left of FIGS. 2A-2D the vector diagram illustrates the $90°_x$ rotation tipping the magnetization from Z to the x-y plane by application of a pulse 10 directed along the $+x$ axis; in each of the four subsequences the transverse magnetization $M_t$ continues to precess and then experiences a 180° pulse directed along $+x$, $-x$, $+y$, $-y$ producing the rotations about the corresponding axes as shown.

Spin echo techniques as above described, employ 90° pulses whereas it is well known that experimental sensitivity can be optimized using smaller flip angles at a higher repetition rate. This may be implemented after the method of FIG. 3, another embodiment of the invention utilizing $\theta_x$ pulses 60 to produce a projection in the x-y plane of the magnetization vector, sufficient for achieving desired signal-to-noise criteria. The precessing components in the x-y plane disperse during the interval 62 and inversion in the z axis is accomplished by 180° pulse 64. The precessing vector components in the x-y plane refocus during the interval 66A. If acquisition were to commence at this point (single spin echo) the experiment would encounter a large (inverted) $-z$ component of magnetization. Accordingly, the precessing vectors are permitted to disperse again over the interval 66B and a reinverting pulse 68 then restores the z component of the magnetization to its original sense, reversing once more the phase of the precessing components in the x-y plane. Refocusing occurs again over the interval 70 and acquisition of the signal 72 is then initiated.

Turning now to FIGS. 4A and B, a prior art delay and acquire spectrum is compared with a double spin echo spectrum. The peak is due to $^{15}N$ obtained from 90% solution of $CHONH_2$ using a Varian XL-200 operating at 20.3 MHz with spectral width 10 KHz. The spectra shown at FIG. 4A interposes a 20 microsecond delay between the pulse and data acquisition, whereas the double spin echo spectrum of FIG. 4B employed characteristic time $\tau = 500$ microseconds for a total interval of 2 msec between excitation and acquisition. The spectra are plotted on the same scale after averaging over 512 excitations. The observing pulses are 8° and 20 Hz line broadening is applied to emphasize base line roll. In this comparison $T_2$ for the sample under study greatly exceeds the duration of the acoustic ringing signal.

The double spin echo as described is still subject to constraints that the ringing incident to the 180° pulses attentuate in a time $T_r << T$ (the evolution/refocusing intervals). This constraint may be relaxed in an enhancement of the double spin echo embodiment wherein the pulse sequence of FIG. 3 is repeated in a phase cycled grand sequence of four double spin echo measurements as shown in FIGS. 5A-D. The subscripted notation is an obvious extension of discussion of FIG. 2. As in that embodiment, so here also the several corresponding 180° pulses of the subsequences would be cycled in phase as $+x$, $-x$, $+y$, $-y$ (or the reverse thereof). The reinversion pulses 68 are subscripted $= \pm p$, $+q$ to emphasize the phase cycling applied separately to these pulses. The only requirement for the relationship of these phases is $|p-q| = \pi/2$. The evolution/refocusing intervals may now be made extremely short without constraints arising from the relative lengths of the acoustic ringing decay time and the characteristic transverse relaxation times of the observed resonances.

Turning now to FIG. 6, the pulse sequence of the preferred embodiment employs $\theta_x$ pulse 80, and immediate signal acquisition 82. The signal is incrementally accumulated in memory, indicated by the symbol "+". A fixed delay period 84 permits the signal to recover to an acceptable lever after which the application of a 180° pulse 86 then inverts the magnetization in the z axis and another interval 88 of length $\tau$ permits decay of the ringing due to the 180° pulse 86. A $\theta_x$ pulse 90 identical to pulse 80 is applied and another signed acquisition 92 is initiated and decremented from the cumulative signal in memory, symbolically designated "−", e.g., opposite the sign of the first pair of acquisitions. The joint result of the 180° inversion and the opposite accumulation phases is that the acquired signals add, whereas the ringing portion incident to the $\theta_x$ signals, although coherent, is unaltered by the spatial inversion and therefore the acoustic ringing contribution cancels between pairs of $\theta_x$ excitations.

In another implementation of the above described embodiment, FIGS. 7A and 7B illustrate phase cycling applied to the sequence of FIG. 6 in order to compensate the ringing contribution of the inversion pulses 86. The sequence of FIG. 6 is followed by a second similar sequence wherein the 180° pulses are cycled alternately between +x and −x (or +y and −y). As a result, the constraint relating $\tau$ and $T_r$ (from preceding 180° pulse) is relaxed, e.g., $\tau$ can be rather short and/or $T_r$ can be rather long without adverse effect.

In the form, as described above, there is a clear caveat in the observation that the z magnetization is inverted at the conclusion of a simple two excitation sequence. If the delay 84 is of sufficient length relative to $T_1$ the two excitations of an elementary sequence are substantially independent in that the remaining inverted z magnetization returns to its equilibrium value before the subsequent excitation. This constraint may be relaxed if there is an additional 180° pulse in any sequence to restore the inverted magnetization. This can take the form of insertion of an additional such inverting pulse 94 at the conclusion of the acquisition 92. Phase cycling of the reinversion pulse 94 is preferred. The insertion of phase cycled inverting pulses 94 therefore insures that the remanent magnetization effects and acoustic ringing from such pulses are cancelled. Ringing introduced by the reinverson pulses 94 can be compensated without affecting the signal if the relative phases of alternate reinversion pulses is $\pi/2$. The relative phase of these pulses is arbitrary when either $T_1$ or $T_2$ is relatively short and of course, where both $T_1$ and $T_2$ are relatively short the reinversion pulses are unnecessary.

Figure 8B:
Figure 8C:
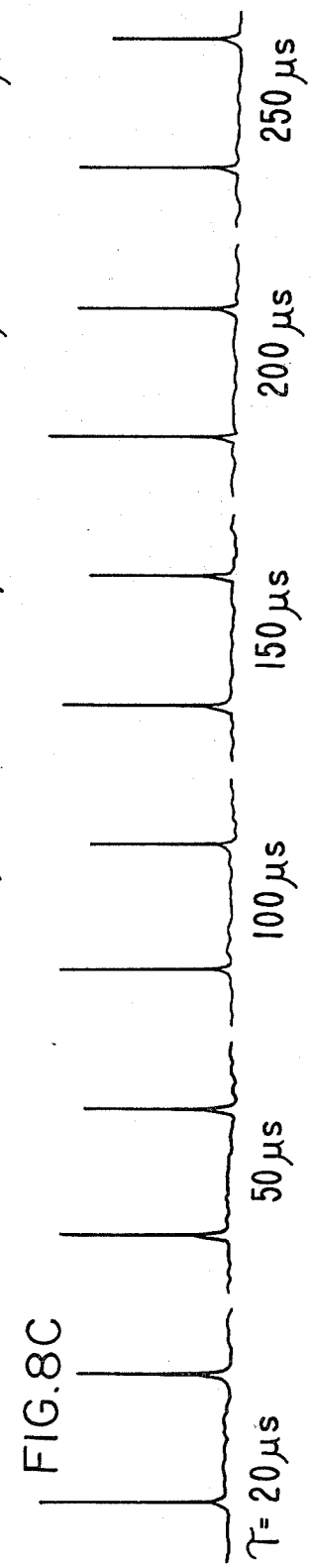

Examples of spectra obtained by the prior art delay method and the sequences of FIGS. 3 and 6 are shown in FIG. 8. A 25% $D_2O$-75% acetone solution was examined on a Varian XL-200 spectrometer at a frequency of 27.1 MHz. The spectral width was 30.030 KHz and the resulting spectra are the average over 1024 excitations at a repetition rate of 20 msec. The two peaks are due to the $^{17}O$ components of the heavy water and the acetone. An example of the spectra obtained via the embodiment of FIG. 6 is shown in FIG. 8C. The example of the delayed acquisition method of the prior art is shown in FIG. 8A for a number of delay times interposed between the observe pulse and acquisition. Substantial spectral artifacts are prevalent except for the longest delay period. The six spectra on an identical scale are parameterized by successive value for delay times or refocusing times. The difference between spectra for the respective values of $\tau$ is minimal whereas the contrast with the spectra of FIGS. 8A and 8B is clear as to the absence of spectral artifact for the shorter values of $\tau$ or delay time. In contrast to the example of FIG. 4B where $T_2 >> T_r$, the double spin echo measurement of FIG. 8B is an example where $T_2$ is no longer so large compared to $T_r$. In FIGS. 8B and 8C the observe pulse and receiver phase were cycled 90° in addition to the phase cycling which is the subject of the present work. In accord with known art, the 180° pulses are composites to minimize effects from miscalibration and off-resonance couplings.

One skilled in the art will observe that although a particular parasitic effect has been referenced, any similar transient of instrumental origin may be compensated by the methods taught herein.

Other modifications and alternative methods can be employed within the present invention which is limited only by the scope of the appended claims.

What is claimed is:

1. A method of gyromagnetic resonance spectroscopy operative upon an assembly of gyromagnetic resonators immersed in a polarizing magnetic field, said field directed along a first axis, wherein the magnetization vectors of said gyromagnetic resonators precess about said polarizing magnetic field, comprising the steps of
    (a) tipping the magnetic vectors 90° from said first axis, said tipping accomplished by rotating said magnetic vector about a second axis, said second axis orthogonal to said first axis and said rotation of selected sense, whereby said magnetic vectors rotate in a plane orthogonal to said first axis,
    (b) permitting the progressive loss of phase coherence among said rotating magnetic vectors for an interval of time T,
    (c) reversing the sense of rotation of said magnetic vectors by inverting the sense of said first axis through rotation of 180° with respect to said first axis, whereby said progressive loss of phase coherence is reversed,
    (d) permitting the progressive approach to phase coherence among said rotating magnetic vectors,
    (e) detecting a spin echo resonance signal of said resonators, said signal possibly containing transients of instrumental origin arising from steps (a) and (c),
    (f) storing said resonance signal,
    (g) repeating the steps (a) and (b) and inverting the sense of said first axis by rotating said coordinate systems through 180° with respect to said first axis, said rotation accomplished about said second axis, said rotation sense opposite said selected sense and repeating the steps (d) through (e),
    (h) adding the signal stored in step (f) with the signal detected in step (g) to form a cumulative signal free of transients arising from said 180° rotations of steps (c) and reinversion of step (g),
    (i) repeating steps (a) and (b) and inverting the sense of said first axis by rotation of said magnetic vector about a third axis, said axis orthogonal to said first and second axes and said 180° rotation having second selected sense whereby said loss of phase coherence is reversed and repeating again steps (d) and (e), (j) subtracting the signal detected in step (i) from the cumulative signal obtained at step (h) and storing said cumulative signal, (k) repeating steps (a) and (b) and inverting the sense of said first axis by rotation of said magnetic vector through 180° about said third axis, said 180° rotation in sense opposite said second selected sense and repeating steps (d) through (e), (l) subtracting the signal detected in step (k) from said cumulative signal obtained and stored at step (j) and storing said new cumulative signal, whereby ringing incident to step (a) repeated at step (g) is canceled against the ringing experienced at steps (i) and (k).

2. A method of gyromagnetic resonance spectroscopy operative upon an assembly of gyromagnetic resonators immersed in a polarizing magnetic field oriented along a first axis wherein the magnetization vectors of said gyromagnetic resonators precess about said polarizing magnetic field comprising the steps of (a) rotating said magnetization vectors through a selected angle with respect to said first axis, said rotation carried out in selected sense about a second axis orthogonal said first axis, (b) permitting the progressive loss of phase coherence among said gyromagnetic resonators for interval of time T, (c) inverting the sense of said first axis by rotating the system 180° with respect to said first axis, said rotation carried out and accompanied by ringing, (d) permitting the increase of phase coherence among said gyromagnetic resonators for another interval of time, (e) repeating step (c), (f) detecting the double spin echo resonance of said resonators whereby the magnetization component remaining along said first axis after step (a) and inverted by step (e) is restored to the initial orientation thereof, (g) said rotation of step (c), phase cycled among phases of 90° separation in subsequent repetition of steps (a) through (f).

3. A method of magnetic resonance spectroscopy of gyromagnetic resonators comprising (a) polarizing the magnetic vectors of said resonators about the polarization axis whereby the vectors representative of said resonators precess about said polarization axis, (b) coherently tipping said magnetic vectors through a desired angle with respect to said polarization axis, (c) detecting and storing a resulting first resonance signal, (d) delaying for a fixed interval of time, (e) inverting said magnetization vectors 180° with respect to the direction of polarization, (f) again coherently tipping said magnetic vector through said desired angle with respect to said polarization axis and obtaining a second resonance signal, (g) subtracting said second signal from said first signal to form a cumulative signal and storing said cumulative signal whereby the nonresonant portions of said signal accompanying said steps of coherent tipping and again coherent tipping will cancel, while resonant portions of said signals add.

4. The method of claim 3 wherein said steps (a) through (g) inclusive are repeated and alternate steps of inverting occur with a phase separation of 180°.

5. The method of claim 4 wherein said step of subtracting and storing further comprises reinverting said precessing magnetic vectors.

6. The method of claim 5 wherein alternate steps of reinverting are related in phase by 90°.

* * * * *